(12) United States Patent
Hirano

(10) Patent No.: US 9,566,649 B2
(45) Date of Patent: Feb. 14, 2017

(54) COATED CUTTING TOOL

(71) Applicant: TUNGALOY CORPORATION, Iwaki-shi, Fukushima (JP)

(72) Inventor: Yusuke Hirano, Iwaki (JP)

(73) Assignee: Tungaloy Corporation, Iwaki-Shi, Fukushima (JP)

( * ) Notice: Subject to any disclaimer, the term of this patent is extended or adjusted under 35 U.S.C. 154(b) by 324 days.

(21) Appl. No.: 14/346,436

(22) PCT Filed: Sep. 24, 2012

(86) PCT No.: PCT/JP2012/074318
§ 371 (c)(1),
(2) Date: Mar. 21, 2014

(87) PCT Pub. No.: WO2013/042790
PCT Pub. Date: Mar. 28, 2013

(65) Prior Publication Data
US 2014/0227052 A1    Aug. 14, 2014

(30) Foreign Application Priority Data

Sep. 22, 2011    (JP) .................................. 2011-207564

(51) Int. Cl.
*C23C 16/34* (2006.01)
*B23B 27/14* (2006.01)
(Continued)

(52) U.S. Cl.
CPC .................. *B23B 27/14* (2013.01); *B23C 5/16* (2013.01); *C23C 16/34* (2013.01); *C23C 16/36* (2013.01);
(Continued)

(58) Field of Classification Search
USPC .......... 51/307, 309; 428/336, 697, 698, 699, 428/701, 702
See application file for complete search history.

(56) References Cited

U.S. PATENT DOCUMENTS 5,123,934 A * 6/1992 Katayama et al. ............. 51/309
6,183,846 B1 * 2/2001 Moriguchi et al. .......... 428/702
(Continued)

FOREIGN PATENT DOCUMENTS

JP    H03 092204 A    4/1991
JP    06-246513    *    9/1994
(Continued)

OTHER PUBLICATIONS

International Search Report dated Dec. 18, 2012 issued in PCT counterpart application (No. PCT/JP2012/074318).
(Continued)

*Primary Examiner* — Archene Turner
(74) *Attorney, Agent, or Firm* — Womble Carlyle

(57) ABSTRACT

A coated cutting tool has a base material of a WC-based cemented carbide and a film formed on the surface of the base material by a chemical vapor deposition method. The coated cutting tool has a rake face, a flank face and a cutting edge ridgeline part positioned between the rake face and the flank face being provided, wherein a total film thickness of the entire film is 3 to 20 μm in an average film thickness, and one or more oblique cracks where an extension angle of the crack to the surface of the film is 45° or less are present at the rake face within 300 μm from the cutting edge ridgeline part.

16 Claims, 2 Drawing Sheets

(51) Int. Cl.
*B23C 5/16* (2006.01)
*C23C 30/00* (2006.01)
*C23C 16/36* (2006.01)
*C23C 16/40* (2006.01)
*C23C 16/56* (2006.01)

(52) U.S. Cl.
CPC ............ *C23C 16/403* (2013.01); *C23C 16/56* (2013.01); *C23C 30/00* (2013.01); *C23C 30/005* (2013.01); *B23B 2224/00* (2013.01); *B23B 2228/10* (2013.01); *B23C 2224/00* (2013.01); *B23C 2228/10* (2013.01); *Y10T 407/24* (2015.01)

(56) References Cited

U.S. PATENT DOCUMENTS

| | | |
|---|---|---|
| 6,187,421 B1 | 2/2001 | Moriguchi et al. |
| 7,172,807 B2 * | 2/2007 | Fukano et al. ............... 428/698 |
| 8,945,707 B2 * | 2/2015 | Kanaoka et al. ............. 428/336 |
| 2007/0128987 A1 | 6/2007 | Okada et al. |

FOREIGN PATENT DOCUMENTS

| | | |
|---|---|---|
| JP | 2005-220363 A | 8/2005 |
| WO | WO 2010/047431 | 4/2010 |

OTHER PUBLICATIONS

Written Opinion dated Dec. 18, 2012 issued in PCT counterpart application (No. PCT/JP2012/074318).
"Development of CVD Coated Cemented Carbide Tool with High Chipping Resistance", *Bulletin of the Japan Institute of Metals and Materials* (1991), vol. 30, No. 4 pp. 298-300 with English translation.
Official Action dated Jul. 19, 2016, issued in Chinese counterpart application (No. 201280046369.5) with English translation.
Zhiqi, Liant, Practical Rinse Technology Manual Char (39), (Jan. 2000) p. 181.

* cited by examiner

COATED CUTTING TOOL

RELATED APPLICATIONS

This is a 371 US National Phase of International Patent Application No. PCT/JP2012/074318, filed Sep. 24, 2012, and published as WO 2013/042790A1 on Mar. 28, 2013, which claims priority to JP 2011-207564, filed Sep. 22, 2011. The contents of the aforementioned applications are incorporated by reference in their entirety.

This invention relates to a coated cutting tool which shows excellent fracture resistance not only in the case that it is used for heavy cutting such as a steel and cast iron, etc., but also in the case that it is used for milling cutting or interrupted cutting thereof.

BACKGROUND ART

It has heretofore been well known that a coated cutting tool in which a film comprising a kind of a single layer film or two or more kinds of a plural layer film in, for example, a carbide, a nitride, a carbonitride, a carboxide and a carbonitroxide, and an aluminum oxide of Ti is formed by deposition on the surface of the tungsten carbide-based cemented carbide (in the following, WC-based cemented carbide) base material by a chemical vapor deposition method with a total film thickness of 3 to 20 μm has been used for machining of a steel, etc.

In general, when a film is formed on the surface of the WC-based cemented carbide, a tensile stress is remained to the film, so that it has been said that fracture strength of the coated cutting tool is lowered whereby the tool is likely fractured. Until now, it has been proposed to release the residual tensile stress of the film by generating cracks by shot peening, etc., after forming the same, and significant effects have been obtained (for example, see Patent Document 1 and Non-Patent Document 1.). However, depending on the uses or the conditions to be used of the tools, higher fracture resistance is required in some cases.

PRIOR ART DOCUMENT

Patent Document

[Patent Document 1] JP H3-92204A

Non-Patent Document

[Non-Patent Document 1] Katayama, and four others, Journal of The Japan Institute of Metals and Materials, 1991, vol. 30, No. 4, p. 298-300

SUMMARY OF THE INVENTION

Problems to be Solved by the Invention

Labor saving and energy saving are strongly required for machining in recent years, and accordingly, machining tends to be carried out with a higher speed. When the above-mentioned conventional coated cutting tool is used for high-speed interrupted cutting which is under severe cutting conditions, i.e., it is used for high-speed interrupted cutting in which mechanical impacts are loaded repeatedly to a cutting edge ridgeline part with an extremely short pitch, there are problems that fracture or chipping is likely generated in the film, and the tool life is lost in a short period of time.

As a method of releasing the residual tensile stress of the film formed by a chemical vapor deposition method, a method by shot peening has heretofore been known. However, when the cutting test was carried out by using a coated cutting tool in which dry shot blasting has been carried out to the surface of the film with a projection angle of 90°, fracture resistance was insufficient. An object of the present invention is to provide a coated cutting tool excellent in chipping resistance and fracture resistance.

Means to Solve the Problems

The present inventor has carried out a research to improve fracture resistance of a coated cutting tool from the viewpoints mentioned above, and as a result, he has obtained knowledge that chipping resistance and fracture resistance are markedly improved by the following constitutions.

That is, a gist of the present invention is as follows.
(1) A coated cutting tool which comprises a base material of a WC-based cemented carbide and a film formed on the surface of the base material by a chemical vapor deposition method, a rake face, a flank face and a cutting edge ridgeline part positioned between the rake face and the flank face being provided, wherein a total film thickness of the entire film is 3 to 20 μm in an average film thickness, and one or more oblique cracks where an extension angle of the crack to the surface of the film is 45° or less are present at the rake face within 300 μm from the cutting edge ridgeline part.
(2) The coated cutting tool described in (1), wherein an extension depth of the oblique cracks from the surface of the film is 0.3 to 2 μm.
(3) The coated cutting tool of (1) or (2), wherein an average value of the crack intervals at the surface of the film is 20 μm or more and 100 μm or less.
(4) The coated cutting tool of any one of (1) to (3), wherein an average value of the crack intervals at the surface of the film is 40 μm or more and 60 μm or less.
(5) The coated cutting tool of any one of (1) to (4), wherein at least one layer of the film is a Ti compound film comprising at least one selected from the group consisting of a carbide, a nitride, a carbonitride, a carboxide and a carbonitroxide of Ti.
(6) The coated cutting tool of any one of (1) to (5), wherein at least one layer of the film is an aluminum oxide film.
(7) The coated cutting tool of any one of (1) to (6), wherein the film comprises at least one layer of inner films contacting with the base material being a Ti compound film, at least one layer of outer films formed at the surface side than the inner films being an $Al_2O_3$ film, and an adhesive film which comprises at least one compound selected from the group consisting of a carboxide, a nitroxide and a carbonitroxide of Ti, and a carboxide, a nitroxide and a carbonitroxide containing Ti and Al between the Ti compound film and the $Al_2O_3$ film, and contacts with the Ti compound film and the $Al_2O_3$ film.
(8) The coated cutting tool of any one of (1) to (7), wherein oblique cracks are present one or more and 50 or less.
(9) The coated cutting tool of any one of (1) to (8), wherein oblique cracks are present 3 or more and 30 or less.
(10) The coated cutting tool of any one of (1) to (9), wherein the cracks are formed by dry shot blasting or shot peening.
(11) The coated cutting tool of any one of (1) to (10), wherein the cracks are formed by projecting projection materials with a projection angle of 30 to 45° to the surface of the film.

(12) The coated cutting tool of any one of (1) to (11), wherein the cracks are formed by projecting projection materials with a projection rate of 50 to 80 m/sec.
(13) The coated cutting tool of (11) or (12), wherein the projection materials comprise a material having an average particle diameter of 100 to 150 μm and a Vickers hardness of 1,000 or higher.
(14) The coated cutting tool of any one of (11) to (13), wherein the projection materials comprise $Al_2O_3$ or $ZrO_2$.

Effects of the Invention

The coated cutting tool of the present invention is excellent in chipping resistance and fracture resistance. When the coated cutting tool of the present invention is used, an effect of elongating the tool life can be obtained.

EMBODIMENTS TO CARRY OUT THE INVENTION

Figure 1:
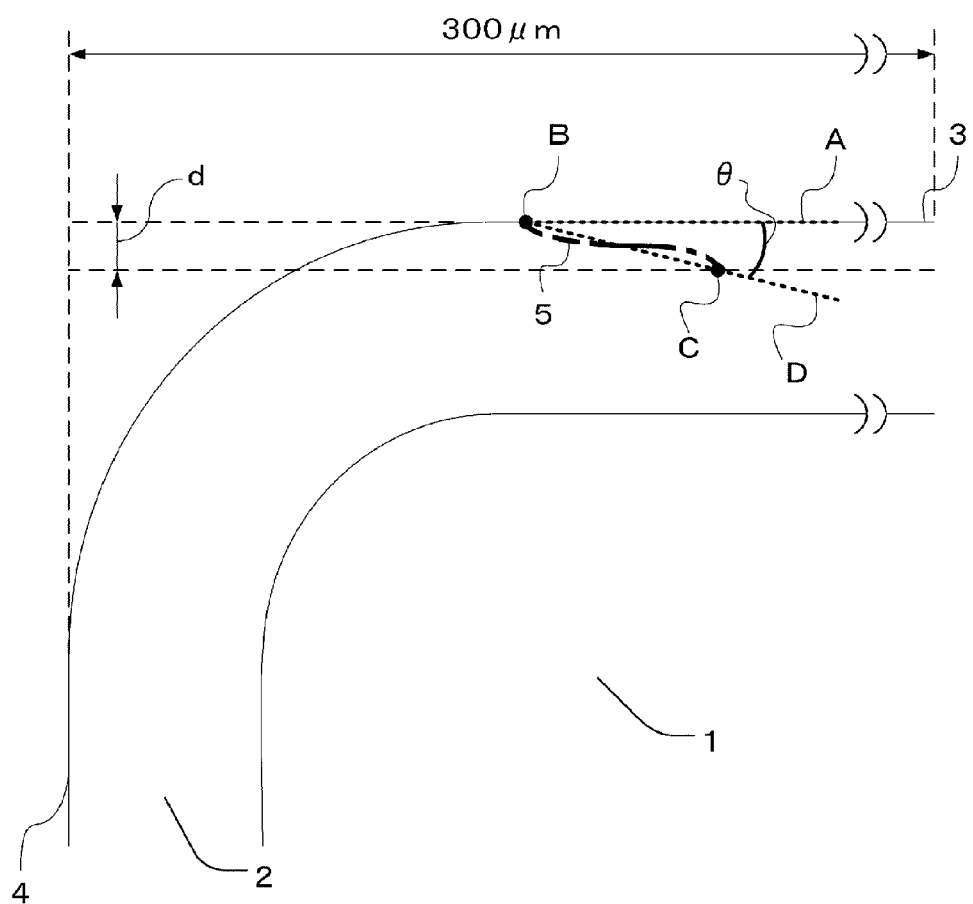
[FIG. 1] It illustrates a cross sectional view of a main part of the coated cutting tool of the present invention.

The coated cutting tool of the present invention comprises a base material of a WC-based cemented carbide and a film formed on the surface of the base material by the chemical vapor deposition method. The WC-based cemented carbide of the present invention is a WC-based cemented carbide obtained by sintering a mixed powder comprising a hard phase-forming powder which comprises WC, or, WC and at least one of a carbide, a nitride or a carbonitride of Ti, Zr, Hf, V, Nb, Ta, Cr, Mo and W and mutual solid solutions thereof (provided that WC is excluded), and a binder phase-forming powder of Co. The WC-based cemented carbide of the present invention is constituted by a hard phase of WC and a binder phase, or, a hard phase of WC, a hard phase comprising at least one selected from the group consisting of a carbide, a nitride or a carbonitride of at least one metal (or an element) selected from the group consisting of Ti, Zr, Hf, V, Nb, Ta, Cr, Mo and W and mutual solid solutions thereof and a binder phase.

The film of the present invention is formed by the chemical vapor deposition method. If it is formed by the chemical vapor deposition method, adhesion strength between the base material and the film can be heightened. This is considered that diffusion occurs at the interface between the base material and the film because a coating temperature of the chemical vapor deposition method is high. Therefore, when the film excellent in wear resistance is formed by the chemical vapor deposition method, a coated cutting tool excellent in wear resistance can be obtained.

The film of the present invention is constituted by at least one layer of a compound film comprising at least one selected from the group consisting of a carbide, a nitride, an oxide, a carbonitride, a carboxide, a nitroxide, a carbonitroxide and a boride of at least one metal (or an element) selected from Ti, Zr, Hf, V, Nb, Ta, Cr, Mo, W, Al and Si. When the compound film is formed on the surface of the WC-based cemented carbide base material, there is a case where a component(s) of the base material, for example, W, C, Co, Mo, Cr, V, etc., is/are diffused from the base material into the compound film, and the essential effects of the present invention are not changed even in such a case.

The film of the present invention is preferably both of a single layer film comprising one layer, and a plural layer film in which two or more layers are laminated. When at least one layer of the film of the present invention comprises a Ti compound film comprising at least one selected from the group consisting of a carbide, a nitride, a carbonitride, a carboxide and a carbonitroxide of Ti, it is more preferred since the balance between wear resistance and toughness can be more heightened.

When at least one layer of the film of the present invention comprises an aluminum oxide film (in the following, $Al_2O_3$ film), it is further preferred since crater wear resistance is improved. A crystal form of the $Al_2O_3$ film is not particularly limited, and may be mentioned an α type, β type, δ type, γ type, κ type, χ type, pseudo τ type, η type and ρ type, etc. Among these, the crystal form of the $Al_2O_3$ film is preferably an α type which is stable at high temperatures, or a κ type which is excellent in adhesiveness with an adhesive film and the $Al_2O_3$ film. In particular, in the case that the region participating in the cutting such as high-speed cutting of a carbon steel or an alloyed steel, etc., becomes a high temperature, if the $Al_2O_3$ film is an α type $Al_2O_3$ film, it is difficult that fracture or chipping is generated.

When at least one layer of inner films contacting with the base material in the film(s) of the present invention is/are a Ti compound film, at least one layer of outer films formed at the surface side which is located outer than the inner films of the present invention is an $Al_2O_3$ film, and an adhesive film comprising at least one compound selected from the group consisting of a carboxide, a nitroxide and a carbonitroxide of Ti, and a carboxide, a nitroxide and a carbonitroxide of containing Ti and Al is present between the Ti compound film and the $Al_2O_3$ film, which is contacting with the Ti compound film and the $Al_2O_3$ film, it is further preferred since adhesiveness of the Ti compound film and the $Al_2O_3$ film can be improved, and wear resistance, toughness and crater wear resistance can be improved. The adhesive film may be specifically mentioned TiCO, TiNO, TiCNO, TiAlCO, TiAlNO and TiAlCNO, etc. Among these, the adhesive film is further preferably a compound comprising at least one selected from the group consisting of a carboxide, a nitroxide and a carbonitroxide of containing Ti and Al, and above all, the adhesive film is more preferably a carbonitroxide of containing Ti and Al.

When the total film thickness of the entire film of the present invention is less than 3 μm in an average film thickness, wear resistance is lowered, while if the average film thickness exceeds 20 μm, a cutting edge ridgeline part is likely chipped. Therefore, the total film thickness of the entire film of the present invention is defined to be 3 to 20 μm in the average film thickness. Among these, the total film thickness of the entire film is more preferably 3.5 to 18 μm in the average film thickness.

<Inner Films>

The inner films of the present invention are formed by the chemical vapor deposition method at the surface of the cemented carbide base material. If an average film thickness of the inner films is less than 1.5 μm, wear resistance of the coated cutting tool is lowered, while if it exceeds 15 μm, chipping starting from the exfoliated portion of the film is likely generated. Therefore, in the present invention, the average film thickness of the inner films is preferably set to 1.5 to 15 μm, and among these, the average film thickness of the inner films is more preferably set to 2 to 13 μm.

<Outer Films>

If an average film thickness of the outer films of the present invention is less than 1.1 μm, crater wear resistance at the rake face of the coated cutting tool of the present invention is not improved, while if the average film thickness exceeds 10 µm, the blade edge is likely fractured. By these reasons, the average film thickness of the upper films is preferably set to 1.1 to 10 µm.

<Adhesive Film>

If an average film thickness of the adhesive film of the present invention is less than 0.4 µm, adhesiveness of the coated cutting tool of the present invention is not improved, while if the average film thickness exceeds 2 µm, strength of the adhesive film itself is lowered, so that the average film thickness of the adhesive film is preferably set to 0.4 to 2 µm.

When the film is formed by the chemical vapor deposition method, the film cannot endure the residual tensile stress, which causes cracks at the surface of the film to the substantially perpendicular direction, and the cracks reach from the surface of the film to the base material. Also, a mechanical treatment such as dry shot blasting, etc., has been carried out as one of the purposes for releasing the residual tensile stress existing at the film, but the cracks are generated at the film by the mechanical treatment such as dry shot blasting, etc. Among the cracks existing at the film, the cracks which extend with an extension angle of exceeding 45° to the surface of the film are called as the perpendicular cracks, and the cracks which extend with an extension angle of 45° or less to the surface of the film are called as the oblique cracks. At the coated cutting tool of the present invention, it is necessary to present one or more oblique cracks, and in the coated cutting tool of the present invention, the perpendicular cracks may be present with the oblique cracks without any problem.

The extension angle of the cracks and the extension depth of the cracks can be obtained, for example, as follows. A photograph of an SEM (scanning electron microscope) image at a fracture surface of the coated cutting tool or a photograph of an SEM at a mirror polished surface of a cross section of the coated cutting tool is taken. In the SEM image of the fracture surface or the mirror polished surface of the cross section, as shown in FIG. 1, a straight line A which is a parallel direction to a rake face 3 of a film 2 is drawn at the surface of the film 2 so as to intersect with a starting point B of a crack 5 (bold line) at the film 2 surface formed at the surface of a base material 1, and a line passing through the point B at which the straight line A at the surface and the crack 5 intersect, and a point C at which the crack 5 is farthest from the surface is made a straight line D. However, when a plural number of points C are present, a point having the longest distance between the point B and the point C among these is set as the point C. An angle θ formed by the straight line A and the straight line D is made an extension angle of the crack 5. A perpendicular distance d from the film surface to the point C farthest from the straight line A of the film surface is made an extension depth. An oblique crack 5 which has an extension angle of 45° or less of the crack 5 to the parallel direction to the surface of the film 2 looks like not continued as shown in the crack 5 of FIG. 1 in some cases. This can be considered that it looks like not continued when the oblique crack 5 is extended through grain boundaries of the crystal grains. Accordingly, the crack which can be seen not continued but is actually continued is deemed to be one oblique crack. When the coated cutting tool of the present invention has one or more oblique cracks having an extension angle of 45° or less at the rake face within 300 µm from a cutting edge ridgeline part, fracture resistance and chipping resistance are improved. Among these, when 50 or more oblique cracks are present at the rake face within 300 µm from a cutting edge ridgeline part, two or more oblique cracks are easily connected, and a tendency of lowering in fracture resistance and chipping resistance is shown, so that one or more and 50 or less oblique cracks are preferably present. Among these, when 3 or more and 30 or less oblique cracks are present, it is further preferred since fracture resistance and chipping resistance are further improved. Incidentally, when oblique cracks are to be confirmed by observing one portion of the fracture surface or one portion of the mirror polished surface of the cross section per one sample, it can be understood that the oblique cracks are present. Even when by observing three portions or more of the fracture surfaces or three portions or more of the mirror polished surface of the cross section, one or more oblique cracks can be confirmed in all the fracture surfaces or in all the mirror polished surfaces of the cross sections, it can be understood that the oblique cracks are present with a wide range. Incidentally, a width of the cutting edge ridgeline part is about 30 to 70 µm.

The coated cutting tool of the present invention has, as shown in FIG. 1, a rake face 3, a flank face 4 and a cutting edge ridgeline part positioned between the rake face and the flank face being provided (curved face part), and one or more oblique cracks where an extension angle of the crack is 45° or less are present at the rake face within 300 µm from the cutting edge ridgeline part, that is, the rake face except for the cutting edge ridgeline part within 300 µm from the extended line of the flank face 4 to the direction of the rake face 3. In the case that the oblique cracks where an extension angle of the crack is 45° or less are present at the rake face within 300 µm from the cutting edge ridgeline part, even if the oblique cracks are extended to the surface portion of the film due to the impact at the time of cutting, the cracks do not extend to the inside of the base material, so that fracture resistance and chipping resistance are improved. In addition, the oblique cracks may be also present at the rake face exceeding 300 µm from a cutting edge ridgeline part. Incidentally, in the coated cutting tool of the present invention, there is a case where extremely minor chip(s) is/are generated at the film surface by extending the oblique cracks to the surface portion of the film due to the impact at the time of cutting, but even in the case, they do not cause chipping or fracture, so that the effects of improving fracture resistance and chipping resistance of the present invention are not changed.

In the coated cutting tool of the present invention, the reason why the extension angle of the oblique cracks is made 45° or less is that if the extension angle of the cracks becomes large exceeding 45°, cracks of the film extend to the base material at the time of cutting, whereby more remarkable chipping is likely generated, and fracture is easily generated at the initial stage of the processing. Therefore, the extension angle of the oblique cracks was made 45° or less.

In the coated cutting tool of the present invention, an extension depth of the oblique cracks is preferably set to 0.3 to 2 µm from the surface of the film to the depth direction. If the extension depth of the oblique cracks is less than 0.3 µm, effects of improving fracture resistance and chipping resistance cannot sufficiently be obtained. To the contrary, if the extension depth of the oblique cracks becomes large exceeding 2 µm, exfoliation is generated at the inside of the film or at the interface between the layers constituting the film comprising the plural layered films at the time of cutting, and a tendency of generating a minor chip(s) is observed.

As a method of generating oblique cracks at the surface portion of the film, there may be mentioned a method of providing mechanical impact such as dry shot blasting, shot peening, etc. When the dry shot blasting or the shot peening is used, by projecting projection materials with a projection angle of 30 to 45° to the surface of the film, the extension angle of the cracks can be made 45° or less. Among these, the projection angle is further preferably 35 to 40°. If the projection angle is less than 30°, sufficient residual stress releasing energy cannot be provided, while if the angle is large exceeding 45°, the extension angle of the cracks becomes large exceeding 45°, whereby fracture resistance and chipping resistance are markedly lowered. Among these, by the method using dry shot blasting or shot peening, it is further preferred that the projection materials having high hardness and having an average particle diameter of 100 to 150 μm are projected with a projection rate of 50 to 80 m/sec and a projection time of 3 to 60 sec. Above all, it is more preferred that the projection materials having high hardness and having an average particle diameter of 120 to 140 μm are projected with a projection rate of 60 to 70 m/sec and a projection time of 5 to 30 sec. This is because, if the dry shot blasting or the shot peening is carried out by using a projection material having low hardness such as steel balls (Vickers hardness Hv: 200 to 600), etc., with a projection angle of 30 to 45°, the projection material is elastically deformed when it is collapsed to the sample, whereby a sufficient residual stress releasing energy cannot be provided, and thus, a projection material having high hardness and difficulty elastically deformed is preferred. As the projection material having high hardness, there may be specifically mentioned a projection material having Hv of 1,000 or more, and there may be mentioned, for example, a projection material made of $Al_2O_3$ (Hv: 1800 to 2000) or a projection material made of $ZrO_2$ (Hv: 1250 to 1300), etc. In addition, if an average particle diameter of the projection material is less than 100 μm or a projection rate becomes less than 50 m/sec, a sufficient residual stress releasing energy cannot be provided, while if an average particle diameter of the projection material exceeds 150 μm or the projection rate of exceeds 80 m/sec, chipping is generated at the cutting edge ridgeline part of the tool in some cases.

An average value of the crack intervals at the surface of the film is preferably 20 μm or more and 100 μm or less. If the average value of the crack intervals at the surface of the film is made the above intervals, it is possible to effectively reduce the residual tensile stress, and fracture resistance and chipping resistance can be further improved. If the average value of the crack intervals is less than 20 μm, a tendency of easily exfoliating the film can be observed, while if the average value of the crack intervals becomes large exceeding 100 μm, a tendency of difficulty improving fracture resistance and chipping resistance at the time of cutting can be observed since release of the residual tensile stress energy is insufficient, so that the average value of the crack intervals is preferably 20 μm or more and 100 μm or less. Among these, the average value of the crack intervals is further preferably 40 μm or more and 60 μm or less.

As a method for measuring the crack intervals at the surface of the film, there may be mentioned, for example, the following method. When the surface of the film in which the crack intervals are measured is mirror polished, and subjected to etching with fluonitric acid, the cracks can be easily observed. After completely removing the fluonitric acid, the mirror polished surface is photographed by an optical microscope with a 75 to 150 magnification to obtain an optical microscope photograph. Several straight lines are drawn to the obtained optical microscope photograph, and a distance between intersection points of the crack and the straight line, which is made a crack interval. At least 50 portions of the crack intervals are to be obtained, and an average value of the crack intervals can be obtained from these values.

As the method for manufacturing the coated cutting tool of the present invention, for example, the following method may be mentioned. A base material of a WC-based cemented carbide is prepared and a film is prepared at the surface of the base material by a chemical vapor deposition method. For example, TiN film can be obtained by using a starting gas composition comprising $TiCl_4$: 5.0 to 10.0 mol %, $N_2$: 20 to 60 mol %, and $H_2$: the remainder by the chemical vapor deposition method with a temperature: 850 to 920° C. and a pressure: 100 to 350 hPa. Also, TiCN film can be obtained by using a starting gas composition comprising $TiCl_4$: 10 to 15 mol %, $CH_3CN$: 1 to 3 mol %, $N_2$: 0 to 20 mol %, and $H_2$: the remainder by the chemical vapor deposition method with a temperature: 850 to 920° C. and a pressure: 60 to 80 hPa.

The α type $Al_2O_3$ film can be obtained by using a starting gas composition comprising $AlCl_3$: 2.1 to 5.0 mol %, $CO_2$: 2.5 to 4.0 mol %, HCl: 2.0 to 3.0 mol %, $H_2S$: 0.28 to 0.45 mol %, and $H_2$: the remainder by the chemical vapor deposition method with a temperature: 900 to 1,000° C. and a pressure: 60 to 80 hPa.

The κ type $Al_2O_3$ film can be obtained by using a starting gas composition comprising $AlCl_3$: 2.1 to 5.0 mol %, $CO_2$: 3.0 to 6.0 mol %, CO: 3.0 to 5.5 mol %, HCl: 3.0 to 5.0 mol %, $H_2S$: 0.3 to 0.5 mol %, and $H_2$: the remainder by the chemical vapor deposition method with a temperature: 900 to 1,000° C. and a pressure: 60 to 80 hPa.

TiAlCNO film can be obtained by using a starting gas composition comprising $TiCl_4$: 3.0 to 5.0 mol %, $AlCl_3$: 1.0 to 2.0 mol %, CO: 0.4 to 1.0 mol %, $N_2$: 30 to 40 mol %, and $H_2$: the remainder by the chemical vapor deposition method with a temperature: 975 to 1025° C. and a pressure: 90 to 110 hPa.

After forming a film on the surface of a base material of a WC-based cemented carbide, projection materials are projected so that the projection angle became 30 to 45° to the surface of the film by using the dry shot blasting or the shot peening, the coated cutting tool of the present invention can be manufactured. At this time, it is further preferred to project the projection materials having high hardness and an average particle diameter of 100 to 150 μm with a projection rate of 50 to 80 m/sec.

EXAMPLES

A mixed powder comprising 89% by weight of WC powder having an average particle diameter of 4.5 μm, 2% by weight of TiCN powder having an average particle diameter of 1.5 μm, 2% by weight of (Ta, Nb)C powder having an average particle diameter of 1.5 μm and 7% by weight of Co powder having an average particle diameter of 1.5 μm was sintered to obtain a WC—(Ti, W, Ta, Nb)(C, N)—Co series WC-based cemented carbide. The WC-based cemented carbide was processed to an insert having an ISO standard CNMG120412 shape, which was used as a base material. Incidentally, at the neighbor of the surface of the WC-based cemented carbide base material, a β-free layer comprising WC and Co alone had been formed. A thickness of the β-free layer at the flank face was 15 μm. The film with the film constitution shown in Table 1 was formed on the surface of the WC-based cemented carbide base material by the chemical vapor deposition method. Incidentally, (a) at the fourth layer ($Al_2O_3$ film) of Table 1 represents an α type $Al_2O_3$ film, and (κ) represents a κ type $Al_2O_3$ film.

TABLE 1

| Sample name | Inner films | | Adhesive film | Outer films | | | Total film thickness (μm) |
|---|---|---|---|---|---|---|---|
| | First layer (Substrate side) TiN film Film thickness (μm) | Second layer TiCN film Film thickness (μm) | Third layer TiAlCNO film Film thickness (μm) | Fourth layer Al₂O₃ film Film thickness (μm) | Fifth layer TiCN film Film thickness (μm) | Sixth layer (Surface side) TiN film Film thickness (μm) | |
| Present product 1 | 0.1 | 1.5 | 0.3 | 0.4 (α) | 0.4 | 0.3 | 3.0 |
| Present product 2 | 0.3 | 14.0 | 1.0 | 4.0 (α) | 0.4 | 0.3 | 20.0 |
| Present product 3 | 0.3 | 6.0 | 1.0 | 2.0 (α) | 0.4 | 0.3 | 10.0 |
| Present product 4 | 0.3 | 10.0 | 1.0 | 3.0 (α) | 0.4 | 0.3 | 15.0 |
| Present product 5 | 0.3 | 7.0 | 1.0 | 3.0 (α) | 0.4 | 0.3 | 12.0 |
| Present product 6 | 0.3 | 10.0 | 1.0 | 3.0 (α) | 0.4 | 0.3 | 15.0 |
| Present product 7 | 0.3 | 10.0 | 1.0 | 3.0 (κ) | 0.4 | 0.3 | 15.0 |
| Present product 8 | 0.3 | 10.0 | 1.0 | 3.0 (α) | 0.4 | 0.3 | 15.0 |
| Comparative product 1 | 0.1 | 1.0 | 0.3 | 0.4 (α) | 0.4 | 0.3 | *2.5 |
| Comparative product 2 | 0.3 | 15.0 | 1.0 | 4.0 (α) | 0.4 | 0.3 | *21.0 |
| Comparative product 3 | 0.3 | 4.0 | 1.0 | 2.0 (α) | 0.4 | 0.3 | 8.0 |
| Comparative product 4 | 0.3 | 6.0 | 1.0 | 2.0 (α) | 0.4 | 0.3 | 10.0 |
| Comparative product 5 | 0.3 | 10.0 | 1.0 | 3.0 (α) | 0.4 | 0.3 | 15.0 |
| Comparative product 6 | 0.3 | 10.0 | 1.0 | 3.0 (α) | 0.4 | 0.3 | 15.0 |
| Comparative product 7 | 0.3 | 10.0 | 1.0 | 3.0 (α) | 0.4 | 0.3 | 15.0 |

*Total film thickness is out of the scope of the claim

Dry shot blasting was applied to the coated cutting tools obtained accordingly. The dry shot blasting conditions were subjected to the surface of the film by projecting projection materials made of Al₂O₃ (Hv: 1800 to 2000) having an average particle diameter of 150 μm under the conditions shown in Table 2, whereby the coated cutting tools having different extension angles of the cracks and extension depths are obtained.

TABLE 2

| Sample name | Projecting conditions | |
|---|---|---|
| | Projection angle (°) | Projection rate (m/sec) |
| Present product 1 | 35 | 65 |
| Present product 2 | 35 | 65 |
| Present product 3 | 35 | 65 |
| Present product 4 | 40 | 55 |
| Present product 5 | 45 | 80 |
| Present product 6 | 30 | 55 |
| Present product 7 | 40 | 75 |
| Present product 8 | 30 | 50 |

TABLE 2-continued

| Sample name | Projecting conditions | |
|---|---|---|
| | Projection angle (°) | Projection rate (m/sec) |
| Comparative product 1 | 35 | 65 |
| Comparative product 2 | 35 | 65 |
| Comparative product 3 | 90 | 40 |
| Comparative product 4 | 60 | 40 |
| Comparative product 5 | 75 | 85 |
| Comparative product 6 | 20 | 100 |
| Comparative product 7 | No dry shot blasting treatment | |

The coated cutting tools as the samples were broken, and from the photographs of an SEM image of the fracture surfaces, extension depths, extension angles and a number of the cracks of the coated cutting tools were measured. In Table 3 and Table 4, extension depths and extension angles of the cracks which had been extended from the surface of the film into the middle of the film are shown with respect to each sample. In Table 5 and Table 6, a number of the cracks which had been extended from the surface of the film into the middle of the film are shown with respect to each sample. That is, the measurement results shown in Table 3, Table 4 and Table 5 do not contain the measurement results of the cracks which had reached from the surface of the film to the base material. Incidentally, in Comparative product 7, no crack which had been extended from the surface of the film into the middle of the film was observed.

TABLE 3

| | | Extension depth of cracks (μm) Unlabeled: oblique crack *Perpendicular crack | | | | | Extension angle of cracks (°) Unlabeled: oblique crack *Perpendicular crack | | | | |
|---|---|---|---|---|---|---|---|---|---|---|---|
| Sample name | Sample No. | First crack | Second crack | Third crack | Fourth crack | Fifth crack | First crack | Second crack | Third crack | Fourth crack | Fifth crack |
| Present product 1 | P1a | 0.5 | 0.7 | — | — | — | 18 | 15 | — | — | — |
| | P1b | 0.4 | 0.8 | — | — | — | 20 | 16 | — | — | — |
| | P1c | 0.5 | — | — | — | — | 22 | — | — | — | — |
| | P1d | 0.4 | 0.6 | — | — | — | 18 | 16 | — | — | — |
| Present product 2 | P2a | 1.5 | 2.1 | — | — | — | 25 | 30 | — | — | — |
| | P2b | 1.3 | 1.6 | — | — | — | 22 | 35 | — | — | — |
| | P2c | 2.0 | 2.4 | — | — | — | 38 | 42 | — | — | — |
| | P2d | 0.8 | 1.2 | — | — | — | 25 | 36 | — | — | — |
| Present product 3 | P3a | 1.7 | 2.0 | 1.3 | 1.8 | 1.2 | 22 | 30 | 24 | 20 | 24 |
| | P3b | 1.0 | 0.8 | 1.5 | 1.4 | 1.3 | 23 | 32 | 35 | 27 | 29 |
| | P3c | 0.7 | 1.0 | — | — | — | 30 | 34 | — | — | — |
| | P3d | 1.4 | 1.5 | 1.8 | 1.8 | — | 36 | 42 | 28 | 26 | — |
| Present product 4 | P4a | 1.0 | 0.8 | 1.2 | — | — | 35 | 45 | 42 | — | — |
| | P4b | 1.5 | 1.4 | 0.6 | 1.1 | — | 37 | 43 | 32 | 33 | — |
| | P4c | 1.1 | 1.0 | *0.8 | — | — | 42 | 40 | *47 | — | — |
| | P4d | 0.6 | 0.8 | 1.5 | — | — | 40 | 39 | 33 | — | — |
| Present product 5 | P5a | 1.3 | 1.0 | 0.7 | 1.2 | *1.0 | 28 | 26 | 35 | 30 | *48 |
| | P5b | 1.3 | 1.4 | 0.7 | 1.1 | — | 42 | 45 | 39 | 35 | — |
| | P5c | 1.2 | 1.8 | 1.0 | — | — | 36 | 28 | 27 | — | — |
| | P5d | 1.6 | 0.9 | 0.8 | 1.3 | — | 38 | 25 | 23 | 40 | — |
| Present product 6 | P6a | 0.8 | 0.8 | 1.0 | — | — | 24 | 18 | 20 | — | — |
| | P6b | 0.6 | 0.4 | *1.2 | — | — | 36 | 38 | *46 | — | — |
| | P6c | 1.1 | 1.3 | 1.5 | 0.3 | — | 22 | 26 | 36 | 19 | — |
| | P6d | 0.9 | 1.6 | 1.7 | — | — | 22 | 23 | 18 | — | — |
| Present product 7 | P7a | 2.0 | *1.5 | *1.7 | — | — | 40 | *52 | *55 | — | — |
| | P7b | 1.9 | 2.0 | 1.4 | 1.3 | 1.8 | 42 | 39 | 41 | 37 | 34 |
| | P7c | 1.0 | 1.5 | 1.3 | 1.4 | — | 34 | 31 | 37 | 40 | — |
| | P7d | 0.7 | 1.6 | *1.9 | — | — | 43 | 35 | *48 | — | — |
| Present product 8 | P8a | 0.5 | — | — | — | — | 20 | — | — | — | — |
| | P8b | 0.8 | 0.8 | 0.6 | — | — | 23 | 19 | 34 | — | — |
| | P8c | 1.4 | 1.2 | — | — | — | 16 | 28 | — | — | — |
| | P8d | 1.5 | 1.0 | — | — | — | 17 | 21 | — | — | — |

TABLE 4

| | | Extension depth of cracks (μm) Unlabeled: oblique crack *Perpendicular crack | | | | | Extension angle of cracks (°) Unlabeled: oblique crack *Perpendicular crack | | | | |
|---|---|---|---|---|---|---|---|---|---|---|---|
| Sample name | Sample No. | First crack | Second crack | Third crack | Fourth crack | Fifth crack | First crack | Second crack | Third crack | Fourth crack | Fifth crack |
| Comparative product 1 | C1a | 0.7 | — | — | — | — | 25 | — | — | — | — |
| | C1b | 0.5 | 0.7 | — | — | — | 22 | 16 | — | — | — |
| | C1c | 0.3 | 1.0 | — | — | — | 18 | 25 | — | — | — |
| | C1d | 0.5 | — | — | — | — | 23 | — | — | — | — |
| Comparative product 2 | C2a | 1.8 | *1.5 | — | — | — | 30 | *50 | — | — | — |
| | C2b | *1.7 | *1.8 | 1.2 | 0.8 | — | *56 | *48 | 45 | 40 | — |
| | C2c | 1.9 | 2.2 | — | — | — | 38 | 43 | — | — | — |
| | C2d | *1.6 | *2.3 | — | — | — | *50 | *52 | — | — | — |
| Comparative product 3 | C3a | *2.5 | *2.2 | *2.5 | *1.8 | — | *48 | *62 | *63 | *50 | — |
| | C3b | *2.3 | *2.4 | — | — | — | *60 | *65 | — | — | — |
| | C3c | *1.7 | *2.0 | — | — | — | *46 | *49 | — | — | — |
| | C3d | *1.5 | *1.3 | *1.7 | — | — | *52 | *55 | *61 | — | — |
| Comparative product 4 | C4a | *1.5 | *1.1 | — | — | — | *55 | *51 | — | — | — |
| | C4b | *1.2 | — | — | — | — | *58 | — | — | — | — |
| | C4c | *1.0 | — | — | — | — | *50 | — | — | — | — |
| | C4d | *1.2 | *0.9 | — | — | — | *49 | *53 | — | — | — |
| Comparative product 5 | C5a | *1.5 | *2.0 | *2.3 | — | — | *55 | *70 | *80 | — | — |
| | C5b | *2.2 | *2.5 | *2.4 | *2.7 | — | *72 | *83 | *85 | *75 | — |
| | C5c | *3.0 | *3.2 | *2.8 | *2.7 | — | *86 | *88 | *83 | *76 | — |
| | C5d | *1.8 | *2.4 | *2.0 | *2.5 | *2.0 | *82 | *78 | *72 | *70 | *78 |

TABLE 4-continued

| | | Extension depth of cracks (μm) Unlabeled: oblique crack *Perpendicular crack | | | | | Extension angle of cracks (°) Unlabeled: oblique crack *Perpendicular crack | | | | |
|---|---|---|---|---|---|---|---|---|---|---|---|
| Sample name | Sample No. | First crack | Second crack | Third crack | Fourth crack | Fifth crack | First crack | Second crack | Third crack | Fourth crack | Fifth crack |
| Comparative product 6 | C6a | *1.8 | *2.4 | — | — | — | *60 | *52 | — | — | — |
| | C6b | *1.4 | *1.6 | — | — | — | *47 | *49 | — | — | — |
| | C6c | *0.8 | *1.2 | — | — | — | *53 | *51 | — | — | — |
| | C6d | *1.5 | *1.5 | — | — | — | *61 | *59 | — | — | — |
| Comparative product 7 | C7a | — | — | — | — | — | — | — | — | — | — |
| | C7b | — | — | — | — | — | — | — | — | — | — |
| | C7c | — | — | — | — | — | — | — | — | — | — |
| | C7d | — | — | — | — | — | — | — | — | — | — |

TABLE 5

| Sample name | Sample No. | Number of oblique cracks with extension depth of 0.3 to 2.0 μm (number) | Number of oblique cracks with extension depth exceeding 2.0 μm (number) | Number of perpendicular cracks extended into the middle of the film (number) |
|---|---|---|---|---|
| Present product 1 | P1a | 2 | 0 | 0 |
| | P1b | 2 | 0 | 0 |
| | P1c | 1 | 0 | 0 |
| | P1d | 2 | 0 | 0 |
| Present product 2 | P2a | 1 | 1 | 0 |
| | P2b | 2 | 0 | 0 |
| | P2c | 1 | 1 | 0 |
| | P2d | 2 | 0 | 0 |
| Present product 3 | P3a | 5 | 0 | 0 |
| | P3b | 5 | 0 | 0 |
| | P3c | 2 | 0 | 0 |
| | P3d | 4 | 0 | 0 |
| Present product 4 | P4a | 3 | 0 | 0 |
| | P4b | 4 | 0 | 0 |
| | P4c | 2 | 0 | 1 |
| | P4d | 3 | 0 | 0 |
| Present product 5 | P5a | 4 | 0 | 1 |
| | P5b | 4 | 0 | 0 |
| | P5c | 3 | 0 | 0 |
| | P5d | 4 | 0 | 0 |
| Present product 6 | P6a | 3 | 0 | 0 |
| | P6b | 2 | 0 | 1 |
| | P6c | 4 | 0 | 0 |
| | P6d | 3 | 0 | 0 |
| Present product 7 | P7a | 1 | 0 | 2 |
| | P7b | 5 | 0 | 0 |
| | P7c | 4 | 0 | 0 |
| | P7d | 2 | 0 | 1 |
| Present product 8 | P8a | 1 | 0 | 0 |
| | P8b | 3 | 0 | 0 |
| | P8c | 2 | 0 | 0 |
| | P8d | 2 | 0 | 0 |

TABLE 6

| Sample name | Sample No. | Number of oblique cracks with extension depth of 0.3 to 2.0 μm (number) | Number of oblique cracks with extension depth exceeding 2.0 μm (number) | Number of perpendicular cracks extended into the middle of the film (number) |
|---|---|---|---|---|
| Comparative product 1 | C1a | 1 | 0 | 0 |
| | C1b | 2 | 0 | 0 |
| | C1c | 2 | 0 | 0 |
| | C1d | 1 | 0 | 0 |
| Comparative product 2 | C2a | 1 | 0 | 1 |
| | C2b | 2 | 0 | 2 |
| | C2c | 1 | 1 | 0 |
| | C2d | 0 | 0 | 2 |
| Comparative product 3 | C3a | 0 | 0 | 4 |
| | C3b | 0 | 0 | 2 |
| | C3c | 0 | 0 | 2 |
| | C3d | 0 | 0 | 3 |
| Comparative product 4 | C4a | 0 | 0 | 2 |
| | C4b | 0 | 0 | 1 |
| | C4c | 0 | 0 | 1 |
| | C4d | 0 | 0 | 2 |
| Comparative product 5 | C5a | 0 | 0 | 3 |
| | C5b | 0 | 0 | 4 |
| | C5c | 0 | 0 | 4 |
| | C5d | 0 | 0 | 5 |
| Comparative product 6 | C6a | 0 | 0 | 2 |
| | C6b | 0 | 0 | 2 |
| | C6c | 0 | 0 | 2 |
| | C6d | 0 | 0 | 2 |
| Comparative product 7 | C7a | 0 | 0 | 0 |
| | C7b | 0 | 0 | 0 |
| | C7c | 0 | 0 | 0 |
| | C7d | 0 | 0 | 0 |

The film surface for measuring the crack intervals was mirror polished, and etched by fluonitric acid to observe the cracks. After completely removing the fluonitric acid, the mirror polished surface was photographed by an optical microscope with a 75 to 150 magnification to obtain an optical microscope photograph. Several straight lines were drawn to the obtained optical microscope photograph, and a distance between intersection points of the crack and the straight line, which was made a crack interval. 50 portions of the crack intervals were measured, and an average value of the crack intervals was obtained from these values. In Table 7 and Table 8, an average value of the crack intervals at the surface of the film of each sample was shown.

TABLE 7

| Sample name | Sample No. | Average value of crack intervals (μm) |
|---|---|---|
| Present product 1 | P1a | 30 |
| | P1b | 38 |
| | P1c | 44 |
| | P1d | 45 |

TABLE 7-continued

| Sample name | Sample No. | Average value of crack intervals (μm) |
|---|---|---|
| Present product 2 | P2a | 65 |
| | P2b | 60 |
| | P2c | 58 |
| | P2d | 62 |
| Present product 3 | P3a | 45 |
| | P3b | 50 |
| | P3c | 48 |
| | P3d | 45 |
| Present product 4 | P4a | 58 |
| | P4b | 51 |
| | P4c | 55 |
| | P4d | 52 |
| Present product 5 | P5a | 40 |
| | P5b | 43 |
| | P5c | 52 |
| | P5d | 50 |
| Present product 6 | P6a | 98 |
| | P6b | 100 |
| | P6c | 90 |
| | P6d | 88 |
| Present product 7 | P7a | 16 |
| | P7b | 22 |
| | P7c | 20 |
| | P7d | 18 |
| Present product 8 | P8a | 110 |
| | P8b | 103 |
| | P8c | 109 |
| | P8d | 104 |

TABLE 8

| Sample name | Sample No. | Average value of crack intervals (μm) |
|---|---|---|
| Comparative product 1 | C1a | 25 |
| | C1b | 30 |
| | C1c | 32 |
| | C1d | 28 |
| Comparative product 2 | C2a | 52 |
| | C2b | 49 |
| | C2c | 45 |
| | C2d | 46 |
| Comparative product 3 | C3a | 48 |
| | C3b | 41 |
| | C3c | 40 |
| | C3d | 55 |
| Comparative product 4 | C4a | 50 |
| | C4b | 46 |
| | C4c | 48 |
| | C4d | 43 |
| Comparative product 5 | C5a | 55 |
| | C5b | 57 |
| | C5c | 61 |
| | C5d | 52 |
| Comparative product 6 | C6a | 57 |
| | C6b | 59 |
| | C6c | 64 |
| | C6d | 68 |
| Comparative product 7 | C7a | 160 |
| | C7b | 143 |
| | C7c | 165 |
| | C7d | 152 |

Figure 2:
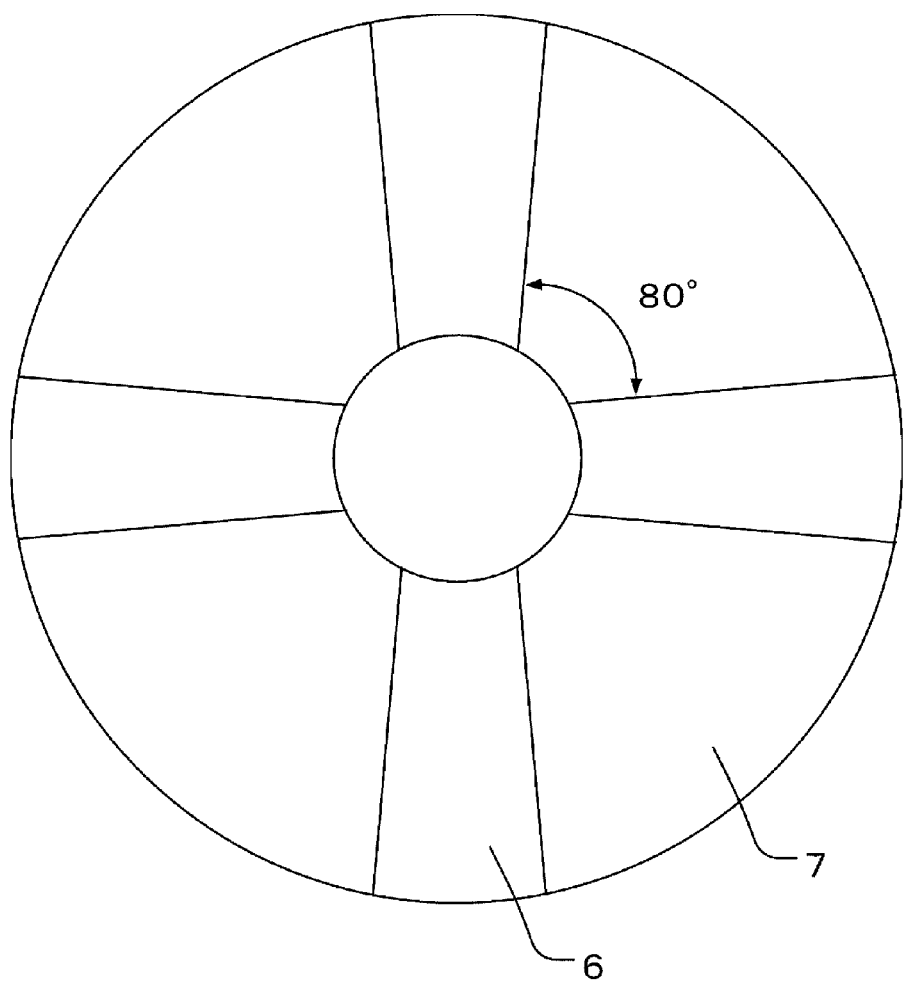
[FIG. 2] It illustrates an outline view of a work piece material used in the cutting test of the present invention.

By using the coated cutting tool, the cutting test was carried out. S53C (hardness: $H_B240$) was used as the work piece material. A shape of the work piece material was made to be a shape in which a hole with a diameter of 50 mm was present at the center of a disc with a diameter of 180 mm×a thickness of 60 mm, and as shown in FIG. 2, four convex portions (an angle formed by an edge of the convex portion and an edge of the adjacent convex portion is) 80° were provided from the center to the outer diameter side. In the cutting test, end face cutting was carried out to the work piece material under the following cutting conditions.

[Cutting Conditions]
Cutting speed: 200 m/min,
Depth of cut: 1 mm,
Feed rate: 0.3 mm/rev,
Cutting atmosphere: Wet (water-soluble emulsion was used),
Number of maximum impact times: 25600 times (6400 times per one work piece material),
Number of tests: 4 times At each of the number of impacts of 6400 times, 12800 times, 19200 times, 25600 times, occurrence of fracture or not was confirmed. The number contacted with the convex portion is a number of the impact times. Incidentally, when the work piece material rotates one time, the coated cutting tool is contacted with the convex portion of the work piece material four times. In Table 9 and Table 10, the number of impact times at which fracture had been generated and an average value thereof were shown.

TABLE 9

| Sample name | Sample No. | Number of impacts (times) | Average value of number of impacts (times) |
|---|---|---|---|
| Present product 1 | P1a | 19200 | 20800 |
| | P1b | 19200 | |
| | P1c | 25600 | |
| | P1d | 19200 | |
| Present product 2 | P2a | 25600 | 20800 |
| | P2b | 19200 | |
| | P2c | 19200 | |
| | P2d | 19200 | |
| Present product 3 | P3a | 25600 | 22400 |
| | P3b | 25600 | |
| | P3c | 12800 | |
| | P3d | 25600 | |
| Present product 4 | P4a | 25600 | 22400 |
| | P4b | 25600 | |
| | P4c | 19200 | |
| | P4d | 19200 | |
| Present product 5 | P5a | 25600 | 24000 |
| | P5b | 19200 | |
| | P5c | 25600 | |
| | P5d | 25600 | |
| Present product 6 | P6a | 19200 | 19200 |
| | P6b | 19200 | |
| | P6c | 19200 | |
| | P6d | 19200 | |
| Present product 7 | P7a | 19200 | 19200 |
| | P7b | 25600 | |
| | P7c | 19200 | |
| | P7d | 12800 | |
| Present product 8 | P8a | 25600 | 19200 |
| | P8b | 19200 | |
| | P8c | 19200 | |
| | P8d | 12800 | |

TABLE 10

| Sample name | Sample No. | Number of impacts (times) | Average value of number of impacts (times) |
|---|---|---|---|
| Comparative product 1 | C1a | 6400 | 6400 |
| | C1b | 6400 | |
| | C1c | 6400 | |
| | C1d | 6400 | |
| Comparative product 2 | C2a | 12800 | 9600 |
| | C2b | 6400 | |

TABLE 10-continued

| Sample name | Sample No. | Number of impacts (times) | Average value of number of impacts (times) |
|---|---|---|---|
|  | C2c | 12800 |  |
|  | C2d | 6400 |  |
| Comparative product 3 | C3a | 6400 | 8000 |
|  | C3b | 6400 |  |
|  | C3c | 12800 |  |
|  | C3d | 6400 |  |
| Comparative product 4 | C4a | 6400 | 9600 |
|  | C4b | 12800 |  |
|  | C4c | 6400 |  |
|  | C4d | 12800 |  |
| Comparative product 5 | C5a | 6400 | 8000 |
|  | C5b | 6400 |  |
|  | C5c | 6400 |  |
|  | C5d | 12800 |  |
| Comparative product 6 | C6a | 12800 | 8000 |
|  | C6b | 6400 |  |
|  | C6c | 6400 |  |
|  | C6d | 6400 |  |
| Comparative product 7 | C7a | 6400 | 8000 |
|  | C7b | 12800 |  |
|  | C7c | 6400 |  |
|  | C7d | 6400 |  |

From the results shown in Table 9 and Table 10, it can be understood that Present products in which one or more oblique cracks with the extension angle of the cracks of 45° or less exist had twice or longer average number of impact times which occur fracture as compared with those of Comparative products, whereby they are markedly excellent in fracture resistance. That is, it can be understood that Present products are markedly longer in tool life than those of Comparative products.

Utilizable Field in Industry

Since the coated cutting tool of the present invention is excellent in chipping resistance and fracture resistance, an effect of elongating the tool life can be obtained when the coated cutting tool of the present invention is used.

EXPLANATION OF REFERENCE NUMERALS

1 Base material
2 Film
3 Rake face
4 Flank face
5 Oblique crack
6 Convex portion
7 Concave portion

The invention claimed is:

1. A coated cutting tool which comprises:
a base material of a WC-based cemented carbide, and
a film formed on the surface of the base material by a chemical vapor deposition method,
a rake face, a flank face, and a cutting edge ridgeline part positioned between the rake face and the flank face being provided, wherein:
a total film thickness of the entire film is 3 to 20 µm in an average film thickness, and
one or more oblique cracks where an extension angle of the crack to the surface of the film is 45° or less are present at the rake face within 300 µm from the cutting edge ridgeline part.

2. The coated cutting tool according to claim 1, wherein an extension depth of the oblique cracks from the surface of the film is 0.3 to 2 µm.

3. The coated cutting tool according to claim 1, wherein an average value of the crack intervals at the surface of the film is 20 µm or more and 100 µm or less.

4. The coated cutting tool according to claim 1, wherein an average value of the crack intervals at the surface of the film is 40 µm or more and 60 µm or less.

5. The coated cutting tool according to claim 1, wherein at least one layer of the film is a Ti compound film comprising at least one selected from the group consisting of a carbide, a nitride, a carbonitride, a carboxide and a carbonitroxide of Ti.

6. The coated cutting tool according to claim 1, wherein at least one layer of the film is an $Al_2O_3$ film.

7. The coated cutting tool according to claim 1, wherein the film comprises at least one layer of inner films contacting with the base material being a Ti compound film, at least one layer of outer films formed at the surface side than the inner films being an $Al_2O_3$ film, and an adhesive film which comprises at least one compound selected from the group consisting of a carboxide, a nitroxide and a carbonitroxide of Ti, and a carboxide, a nitroxide and a carbonitroxide containing Ti and Al between the Ti compound film and the $Al_2O_3$ film, and contacts with the Ti compound film and the $Al_2O_3$ film.

8. The coated cutting tool according to claim 1, wherein less than 50 oblique cracks are present.

9. The coated cutting tool according to claim 1, wherein between 3 and 50 oblique cracks are present.

10. The coated cutting tool according to claim 1, wherein the cracks are formed by dry shot blasting or shot peening.

11. The coated cutting tool according to claim 1, wherein the cracks are formed by projecting projection materials with a projection angle of 30 to 45° to the surface of the film.

12. The coated cutting tool according to claim 1, wherein the cracks are formed by projecting projection materials with a projection rate of 50 to 80 msec.

13. The coated cutting tool according to claim 11, wherein the projection materials comprise a material having an average particle diameter of 100 to 150 µm and a Vickers hardness of 1,000 or more.

14. The coated cutting tool according to claim 11, wherein the projection materials comprise $Al_2O_3$ or $ZrO_2$.

15. The coated cutting tool according to claim 1, wherein:
between 3 and 50 oblique cracks are present;
an extension depth of the oblique cracks from the surface of the film is 0.3 to 2 µm;
an average value of the crack intervals at the surface of the film is 40 µm or more and 60 µm or less; and
the film comprises:
at least one layer of inner films contacting with the base material being a Ti compound film;
at least one layer of outer films formed at the surface side than the inner films being an $Al_2O_3$ film; and
an adhesive film which comprises at least one compound selected from the group consisting of a carboxide, a nitroxide and a carbonitroxide of Ti; and
a carboxide, a nitroxide and a carbonitroxide containing Ti and Al between the Ti compound film and the $Al_2O_3$ film, and contacts with the Ti compound film and the $Al_2O_3$ film.

16. The coated cutting tool according to claim 1, wherein:
an extension depth of the oblique cracks from the surface of the film is 0.3 to 2 µm; and
an average value of the crack intervals at the surface of the film is 20 µm or more and 100 µm or less.

* * * * *